United States Patent [19]

Glance et al.

[11] Patent Number: 5,373,516
[45] Date of Patent: Dec. 13, 1994

[54] RAPIDLY TUNABLE WIDEBAND INTEGRATED LASER

[75] Inventors: Bernard Glance, Colts Neck; Robert W. Wilson, Holmdel, both of N.J.

[73] Assignee: AT&T Corp., Murray Hill, N.J.

[21] Appl. No.: 19,951

[22] Filed: Feb. 19, 1993

[51] Int. Cl.⁵ .................................. H01S 3/10
[52] U.S. Cl. .......................... 372/20; 372/92; 372/6; 372/102; 385/17; 385/37
[58] Field of Search ............ 372/6, 102, 92, 40, 372/98; 385/17, 24, 37

[56] References Cited

U.S. PATENT DOCUMENTS

| | | | |
|---|---|---|---|
| 5,002,349 | 3/1991 | Cheung et al. | 385/1 |
| 5,002,350 | 3/1991 | Dragone . | |
| 5,009,477 | 4/1991 | Alferness et al. | 385/17 |
| 5,136,671 | 8/1992 | Dragone | 385/17 |
| 5,179,605 | 1/1993 | Kaverhad et al. | 385/37 |

Primary Examiner—Léon Scott, Jr.
Attorney, Agent, or Firm—Eugene S. Indyk; Stuart H. Mayer

[57] ABSTRACT

A monolithically integrated wideband laser which is rapidly tunable over a wide optical frequency range comprises two series connected frequency routers of different resolutions formed in a semiconductive wafer defining a tuned cavity. A control circuit applies electrical energy to predetermined controllably transmissive waveguides connecting the frequency routing devices with reflective elements defined in the wafer. This tunes the laser to a desired one of a plurality of optical frequencies. Application of such electrical energy creates frequency selective pathways through the wafer able to support up to hundreds of selected lasing frequencies across the entire bandwidth of a semiconductive medium. This laser is economical to construct and is useful in high capacity, high speed optical communications networks.

6 Claims, 3 Drawing Sheets $N^2$ – FREQUENCY LASER BASED ON FREQUENCY ROUTER

0
RAPIDLY TUNABLE WIDEBAND INTEGRATED LASER

CROSS-REFERENCE TO RELATED APPLICATIONS

This application is related to Application Ser. No. [Glance-Wilson 22-2] of Bernard Glance and Robert Wilson, entitled "Rapidly Tunable Integrated Optical Filter," filed in the Patent and Trademark Office on the same day this application is being filed.

This application is related to Application Ser. No. [Glance-Wilson 23-3] of Bernard Glance and Robert Wilson, entitled "Rapidly Tunable Wideband Integrated Optical Filter," filed in the Patent and Trademark Office on the same day this application is being filed.

This application is related to Application Ser. No. [Dragone-Kaminow 34-41] of Corrado Dragone and Ivan Kaminow, entitled "Rapidly Tunable Integrated Laser," filed in the Patent and Trademark Office on the same day this application is being filed.

TECHNICAL FIELD

This invention relates to optical communications systems. More particularly, this invention relates to lasers used in optical communications systems.

BACKGROUND

The capacity and speed of communications systems may be increased by transmitting information in optical form over networks composed of optically transmissive nodes, fibers, waveguides, and the like. High capacity optical communications systems require that many optical signals be frequency division multiplexed in the components of an optical network. This requires that there be a way of conveniently producing electromagnetic energy at many different frequencies. An ideal device for producing optical energy useful in an optical communications system is a laser. Until now, there has been no convenient approach to creating a large number of optical frequencies with lasers. The performance of prior lasers have been limited in terms of tuning speed, frequency selectivity, or tuning range. All of these prior devices also have been expensive to implement.

SUMMARY

U.S. patent application Ser. No. [Dragone-Kaminow 34-41] of Dragone and Kaminow entitled Rapidly Tunable Integrated Laser describes a rapidly tunable laser based upon wide gain bandwidth photonic integrated circuitry. The laser described in this application uses an N×N frequency routing device such as a multiplexer/demultiplexer described in U.S. Pat. Nos. 5,002,350 and 5,136,671. This laser is rapidly tunable to N discrete output optical frequencies.

Applicants have found that the number of discrete frequencies to which a laser, using such frequency routing devices, may be dramatically increased by utilizing the periodic nature of the frequency routing device. For example, the number of discrete frequencies to which such a laser may be tuned may be up to $N^2$. At the same time, such a laser will be able to fully use the entire bandwidth of semiconductor material used in photonic communications networks. A laser in accordance with this invention will also avoid the possibility of oscillation at multiple frequencies separated by a free spectral region defined by the characteristics of the frequency routing device.

In one example of this invention, a wideband laser takes advantage of the periodic routing properties of frequency routing devices to provide a set of frequencies equal to the square of the number of branches associated with those frequency routing devices. Such frequency routing devices of modest size can be used to build lasers tunable to hundreds of frequencies. This laser may comprise two N×N frequency routing devices connected in cascade. One set of branches from each routing device is connected to one set of branches from the other routing device. Two remaining sets of branches run to the edges of a semiconductive wafer on which the routing devices have been fabricated. The edges are cleaved to form highly reflective mirrors. Each of the branches is terminated by an active section acting as either an optical amplifier or a gate. Active sections are also inserted in series with the branches connecting the two frequency routing devices. The sections can be made optically transparent, with possibly some gain, when they are biased by a predetermined amount of electrical current. For example, such current may be in the range of about 10 to 20 mA. The active sections become highly lossy when no bias current is applied. A selected one of the active sections between the frequency routing devices is used as a lasing section through the application of a sufficient amount of bias current above a lasing threshold. Laser light is obtained from the device by means of an integrated coupler fabricated on one side of the selected active section which is biased. The remaining active sections between the frequency routing devices are unbiased to suppress any light reaching them.

In this example of the invention, there is a high resolution frequency routing device and a low resolution frequency routing device. The high resolution frequency routing device is dimensioned to give passbands separated by a frequency interval $\Delta F$ desired between adjacent laser frequencies. These passbands form periodic sets of laser frequencies. Each set contains N passbands. The sets are spaced by a free spectral range (FSR) $N\Delta F$ wide. Each set of passbands has the same routing characteristics through the frequency routing device. The low resolution frequency routing device is dimensioned to give passbands separated by a frequency interval of $N\Delta F$. Each passband given by the low resolution routing device overlaps N consecutive passbands of the high resolution frequency routing device. There are thus $N^2$ high resolution passbands within one FSR of the low resolution frequency routing device. Activation of appropriate gates associated with the high and low resolution frequency routing devices sets up a transparent route through the semiconductive material between the mirrors for supporting lasing action. In this route stationary optical waves can be sustained for frequencies within a predetermined high resolution passband overlapped by a predetermined low resolution passband associated with this route. Frequencies outside this high resolution passband are suppressed by the unbiased lossy sections.

This is only an example of the invention. The full scope of the invention entitled to an exclusionary right is set forth in the claims at the end of this application.

DETAILED DESCRIPTION

Figure 1:
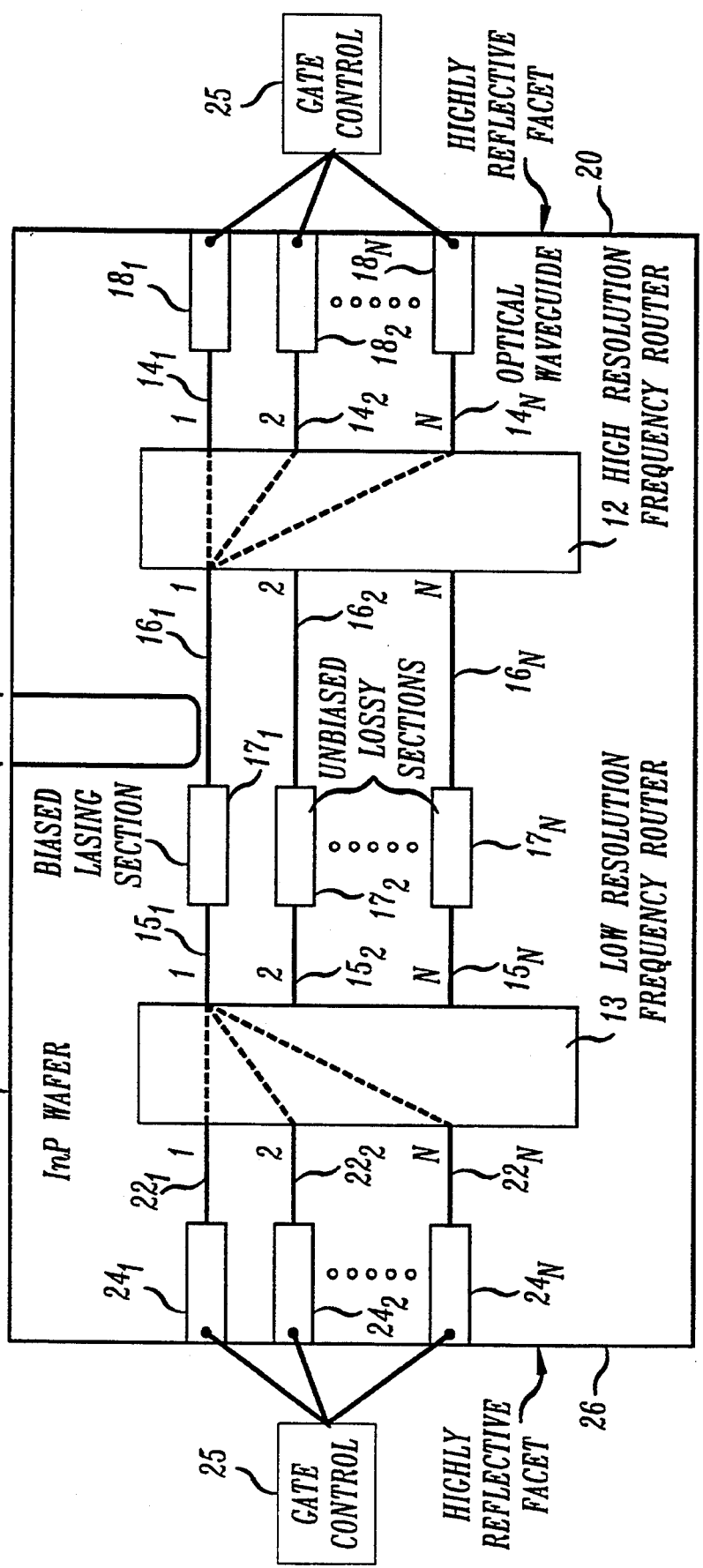
FIG. 1 is a diagram of an example of a wideband tunable laser in accordance with this invention.

FIG. 1 shows an example of a laser which is rapidly tunable over a wide frequency range. It is composed of a high resolution frequency routing device and a low resolution frequency routing device providing frequency selectivity, a number of waveguides for carrying optical signals, and a number of optically active sections for providing optical amplification and lasing behavior. These structures may be monolithically integrated on a semiconductive wafer. They may be created by means of known photolithographic techniques.

FIG. 1 illustrates a wafer 10 made of a semiconductive material such as an indium phosphide material such as InGaAsP. A high resolution $N \times N$ frequency routing device 12 and a low resolution frequency routing device 13 are defined on the wafer 10. A first plurality of waveguides $14_1, 14_2, \ldots, 14_N$ is connected to one end of the frequency routing device 12. A second plurality of waveguides $16_1, 16_2, \ldots, 16_N$ is connected to another end of the frequency routing device 12. A first plurality of optical amplifiers $18_1, 18_2, \ldots, 18_N$ connects respective ones of the first plurality of waveguides to a cleaved face 20 formed in the semiconductive wafer 10. A third plurality of optical waveguides $15_1, 15_2, \ldots, 15_N$ is connected to one end of the frequency routing device 13 and a fourth plurality of optical waveguides $22_1, 22_2, \ldots, 22_N$ is connected to another end of the frequency routing device 13. A second plurality of optical amplifiers $17_1, 17_2, \ldots, 17_N$ joins the first and second pluralities of waveguides in series. One of the second plurality of waveguides is activated to create lasing action in the cavity defined by the wafer 10. A third plurality of optical amplifiers $24_1, 24_2, \ldots, 24_N$ connects respective ones of the fourth plurality of waveguides to a second cleaved face 26 formed in the wafer 10. The two cleaved faces 20 and 26 comprise reflective mirrors defining a tuned cavity in which lasing action can be supported. A gate control circuit 25 (shown in two parts in FIG. 1) selectively provides bias current to predetermined ones of the optical amplifiers, including one of the amplifiers $17_1, 17_2, \ldots, 17_N$, to produce laser light at one of up to $N^2$ discrete frequencies as shown at reference numeral 11 in FIG. 1. The gate control circuit 25 may actually be connected to all of the optical amplifiers in FIG. 1 so that any selected ones of those amplifiers may be turned on to cause the laser to operate at a desired output frequency. Laser light is obtained from the device of FIG. 1 by means of an integrated optical coupler 27 fabricated near one of the waveguides, such as waveguide $16_1$ shown in FIG. 1.

Each optical amplifier comprises a doped section of waveguide with controllable optical transmissivity. The doping may be such that an appropriately configured semiconductor junction is defined in each optical amplifier. These sections are optically active in that application of electrical energy to those sections will cause them to become transmissive to the flow of optical energy and will even provide some degree of gain to optical signals flowing through them. When electrical bias current above a lasing threshold is applied, laser action begins. These doped sections of waveguide are substantially opaque to the transmission of light when there is no applied electrical stimulation. The specially doped sections thus may be considered to be gates or optical amplifiers depending upon whether or not they are excited with electrical energy. The details of creating such sections in a wafer such as the indium phosphide wafer 10 shown in FIG. 1 are generally known, are not a part of this invention, and thus are not described here.

Selectively applying bias current to predetermined ones of the optical amplifiers in FIG. 1 will create certain frequency selective optical pathways between the cleaved faces 20 and 26 due to the behavior of the frequency routing devices 12 and 13. Application of a certain amount of bias current above a lasing threshold to the selected ones of the optical amplifiers will cause lasing action at a frequency supported in the frequency selective optical pathways. Those optical amplifiers which are not given any bias current remain opaque to the transmission of optical energy through them.

Figure 2:
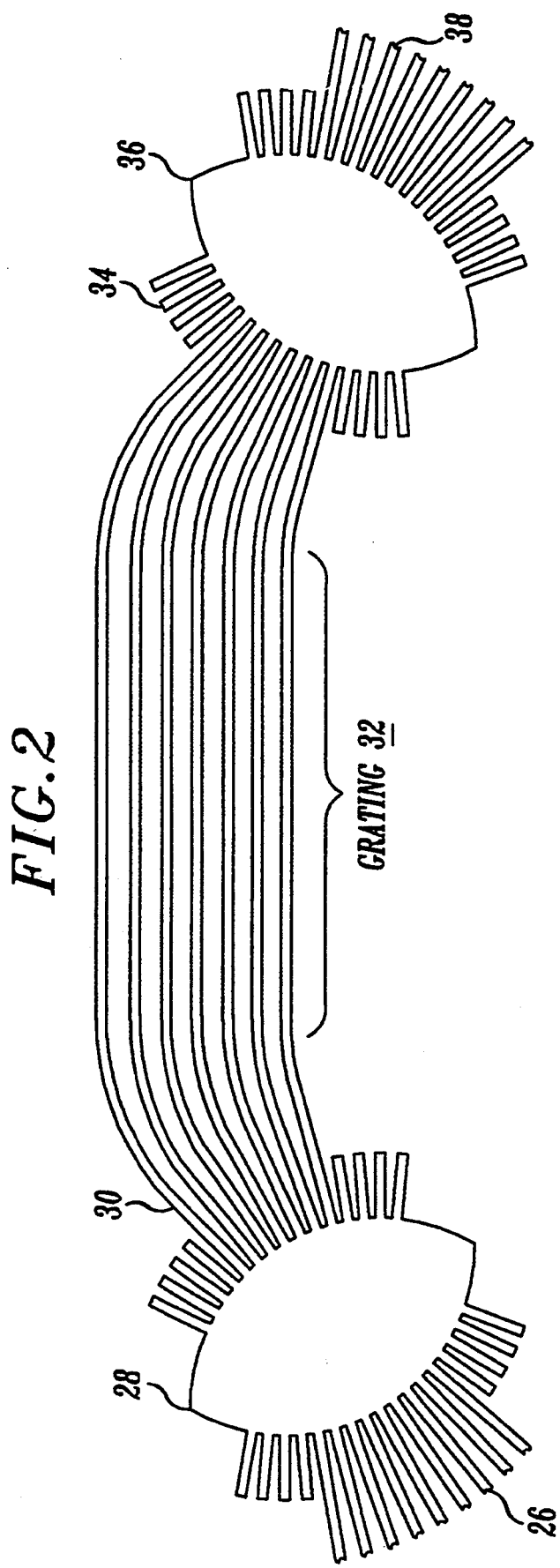
FIG. 2 is a diagram illustrating the details of the frequency routing devices shown in FIG. 1.

FIG. 2 shows the pertinent details of an example of the structure of the routing devices 12 and 13 shown in FIG. 1. Each frequency routing device contains a plurality of input waveguides 26 connected to a free space region 28. A plurality of output waveguides 30 extends from the free space region 28 and is connected to an optical grating 32. The optical grating 32 comprises a plurality of unequal length waveguides which provides a predetermined amount of path length difference between the output waveguides 30 and a corresponding plurality of input waveguides 34 connected to another free space region 36. The free space region 36 is connected to a plurality of output waveguides 38. These frequency routing devices operate as multiplexers and demultiplexers of optical frequencies. The details of their construction and operation are more fully described in the U.S. patents referred to above, the entire contents of which are hereby incorporated by reference into this application. In the case of the frequency routing device 12 in FIG. 1, the input waveguides 26 may be connected to the waveguides $14_1, 14_2, \ldots, 14_N$, respectively, and the output waveguides 38 may be connected to respective waveguides $16_1, 16_2, \ldots, 16_N$. In the case of the frequency routing device 13 shown in FIG. 1, the input waveguides 26 may be connected to respective waveguides $22_1, 22_2 \ldots, 22_N$ shown in FIG. 1 and the output waveguides may be connected to respective waveguides $15_1, 15_2, \ldots, 15_N$ shown in FIG. 1. The frequency resolution of routing devices such as the device shown in FIG. 2 is determined by the geometry of the device, particularly, the magnitude of the path length differences provided by the optical grating 32 shown in FIG. 2.

The wideband tunable laser shown in FIG. 1 takes advantage of periodic routing properties of the $N \times N$ frequency routing devices 12 and 13 to provide a set of possible laser frequencies up to the square of the number of branches N of the routing devices 12 and 13. Frequency routing devices of modest size can thus be used to build lasers tunable over hundreds of frequencies spaced regularly over a range limited only by the gain bandwidth of an active semiconductor medium making up the laser. For example, that gain bandwidth may comprise a bandwidth of 100 nm. around a wavelength of 1.5 microns.

As shown in FIG. 1, a laser in accordance with this invention may have two N×N frequency routing devices 12 and 13 connected in cascade by respective ones of their sets of branches. Two other sets of branches run to edges of the wafer cleaved and coated, if necessary, to form highly reflective mirrors defining a tuned cavity. Each of the branches is terminated by an optical amplifier acting as a gate. The gates may become optically transparent with some gain when biased by an electrical current; they are highly lossy when no bias current is applied. Optical amplifiers are also inserted in series with the branches connecting the two frequency routing devices 12 and 13. One of them is used as a lasing section. The remaining optical amplifiers between the two frequency routing devices 12 and 13 are unbiased to suppress any light reaching them. Laser light is obtained from the device by means of an integrated coupler at an appropriate location next to a waveguide in which the laser light is flowing.

Figure 3:
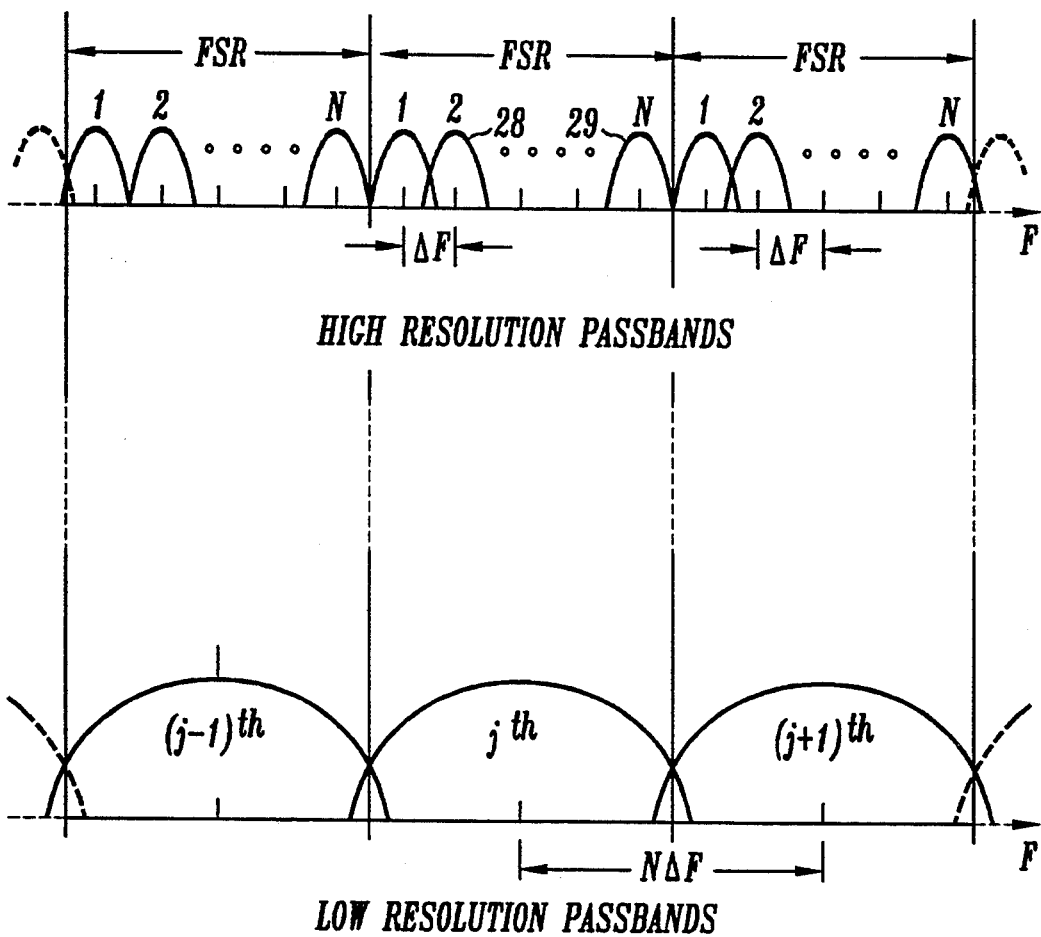
FIG. 3 shows the frequency characteristics of the high resolution frequency routing device and the low resolution frequency routing device shown in FIG. 1.

As illustrated in FIG. 3, the frequency routing device 12 is dimensioned so that it has high resolution passbands separated by a desired frequency interval $\Delta F$ between adjacent laser frequencies. These passbands form periodic sets of passbands each centered about a respective center frequency given one of numbers 1, 2, ..., N in FIG. 3. Each set of passbands comprises N passbands centered about N respective center frequencies. Each set of passbands is labeled as a free spectral region FSR in FIG. 3. Each discrete optical frequency to which the laser of FIG. 1 may be tuned will be located in a respective one of the passbands illustrated in FIG. 3.

Figure 4:
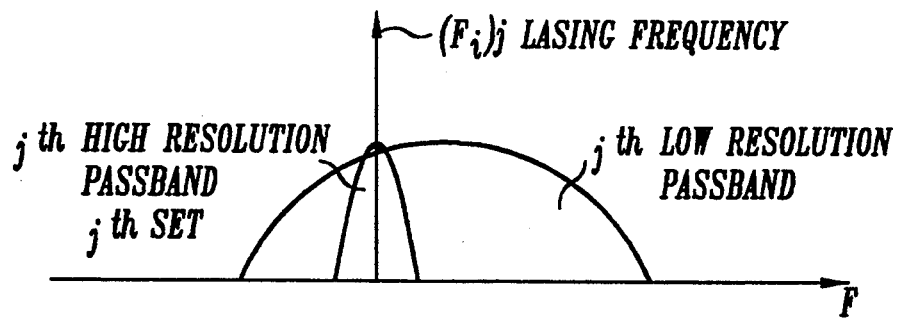
FIG. 4 illustrates the relationship between one particular lasing frequency produced by the device of FIG. 1 in relation to one of the passbands associated with each of the high resolution and low resolution frequency routing devices shown in FIG. 1.

As also illustrated in FIG. 3, the frequency routing device 13 is dimensioned so that it has low resolution passbands each separated by a frequency interval $N\Delta F$. Each of the low resolution passbands overlaps in frequency one of the sets of passbands of the high resolution frequency routing device 12 as shown in FIG. 3. There are thus N high resolution passbands within one of the low resolution passbands. Activation of the $i^{th}$ and $j^{th}$ gates of the high and low resolution frequency routers, respectively, determines a transparent frequency selective route between the reflective faces 20 and 26 and thus determines which lasing frequency will be output by the laser of FIG. 1. In this route, stationary optical waves can only be sustained for frequencies within the $i^{th}$ high resolution passband overlapped by the $j^{th}$ low resolution passband associated with this route, as shown in FIGS. 4 and 5. This passband may be called the $(i^{th})_j$ high resolution passband Frequencies outside the $(i^{th})_j$ high resolution passband are suppressed by inactivated lossy optical amplifiers. Lasing occurs at the Fabry-Perot mode nearest the $(i^{th})_j$ high resolution passband maximum. Adjacent Fabry-Perot modes are suppressed by the selectivity of the passband. Since there are $N^2$ independent routes for the lasing section, this arrangement can provide $N^2$ frequencies distributed at intervals of $\Delta F$ over a frequency range $N^2\Delta F$, the free space region of the low resolution frequency routing device 13. To illustrate the wide tuning capability of a laser in accordance with this invention, assume as an example a laser made of two frequency routing devices designed to give high and low resolution passbands separated by 50 GHz and 800 GHz, respectively. Such a laser can provide 256 discrete frequencies distributed at 50 GHz intervals over a tuning range of 12,800 GHz (about 100 nm around a wavelength of 1.5 microns). The tuning capability of the laser is limited not by the size of the frequency routing device but by the gain bandwidth of the active semiconductive medium in the laser which is about 100 nm in this example. In this case, single frequency operation is insured over the full tuning range since spurious oscillations outside a low resolution FSR ($N^2\Delta F$) are strongly attenuated relative to frequencies within the tuning range $N^2\Delta F$.

Tuning may be done digitally by gating the optical amplifiers using an electrical switch. The laser is insensitive to the level of bias current into the gates and thus can be expected to be very stable. Frequency stability of the laser can also be expected to be excellent since the output frequency mainly depends on invariant integrated paths through a semiconductive wafer such as an indium phosphide wafer. The line width should be narrow because the optical cavity is long. Switching between frequencies can potentially be made at nanosecond speeds by using fast electrical switches. In addition, the laser may be directly amplitude modulated at high bit rate with little frequency chirp. Modulating data can be multicast by making the laser oscillate at several of its frequencies.

One example of the production of a specific output frequency by the laser will serve to illustrate the principles involved in selecting a frequency of operation for the laser and changing that frequency of operation. Assume that it is desired that the laser produce light output at a frequency within a high resolution passband identified with reference numeral 28 in FIG. 3. In that situation, bias current is applied to the optical amplifiers $18_2$, $17_1$, and $24_j$. The optical amplifier $24_j$ is chosen such that frequencies within low resolution passband $j$ pass through the low resolution frequency routing device 13 and are reflected from face 26 of the semiconductive wafer 10 back through the frequency routing device 13. The remaining optical amplifiers shown in FIG. 1 are not biased. Optical energy within the passband 28 is produced by the laser of FIG. 1 as illustrated by reference numeral 11. If it is desired to change the output frequency of the laser to another frequency within the same free space region of the high resolution frequency routing device 12, such as an output frequency within a passband 29 identified in FIG. 3, then the optical amplifier $18_2$ is deactivated and optical amplifier $18_N$ is activated in its place. All other optical amplifiers are biased or unbiased in the same manner as previously described for the production of optical output at frequencies within the passband 28. If it is desired to change the output frequency to some frequency within a low resolution passband other than the $j^{th}$ low resolution passband, then the one of the optical amplifiers $24_1$, $24_2$ ... , $24_N$ which is activated is changed so that the frequency routing device 13 permits the flow of optical energy in the desired low resolution passband to and from the reflective face 26 and through the device 13. Frequencies within this new passband may be selected by activating an appropriate one of the optical amplifiers $18_1$, $18_2$ ..., $18_N$.

The device of FIG. 1 may be tuned to a large number of different optical frequencies used in high speed, high capacity optical communications networks. For example, frequency routing devices with N up to 32 or more may be conveniently fabricated on a single semiconductive wafer. This results in a tunable laser which can be tuned to any of up to $32^2$ or more optical frequencies. The doped sections comprising the optical amplifiers in FIG. 1 may be switched on or off at up to nanosecond speeds thereby resulting in rapid tuning of the FIG. 1 laser to the desired frequencies. Devices such as the laser in FIG. 1 are attractive for large size optical network applications based on frequency division multiplexing.

We claim:

1. A tunable laser, comprising:
    a laser cavity defined by two reflective elements in an actively doped semiconductor wafer;
    a low resolution frequency routing means for defining plurality of low resolution frequency pass bands between the two reflective elements; and
    a high resolution frequency routing means for defining a plurality of high resolution frequency passbands between the reflective elements, the high resolution frequency routing means being in series with the low resolution frequency routing means, the low resolution frequency passbands overlapping a plurality of the high resolution frequency pass bands thereby defining periodic sets of laser frequencies supported in the cavity;
    each of the low resolution and high resolution frequency routing means comprising a plurality of controllable frequency selective pathways optically connecting the reflective elements such that selective gating of the frequency selective pathways causes selected one or more lasing frequencies to be supported in the laser cavity thereby providing tunability of the laser.

2. The laser of claim 1, further comprising:
    a plurality of optical amplifiers in the frequency selective pathways.

3. The laser of claim 2, further comprising:
    a control circuit for selectively activating the optical amplifiers to define a predetermined frequency selective pathway in the laser cavity and to generate lasing action in the predetermined frequency selective pathway.

4. The laser of claim 1, in which the first frequency routing device comprises:
    at least one input waveguide;
    a first free space region connected to the at least one input waveguide;
    a plurality of output waveguides connected to the first free space region;
    an optical grating connected to the plurality of output waveguides comprising a plurality of unequal length waveguides;
    a plurality of input waveguides connected to the optical grating;
    a second free space region connected to the plurality of input waveguides connected to the optical grating; and
    a plurality of output waveguides connected to the second free space region.

5. The laser of claim 1, in which the second frequency routing device comprises:
    at least one input waveguide;
    a first free space region connected to the at least one input waveguide;
    a plurality of output waveguides connected to the first free space region;
    an optical grating connected to the plurality of output waveguides comprising a plurality of unequal length waveguides;
    a plurality of input waveguides connected to the optical grating;
    a second free space region connected to the plurality of input waveguides connected to the optical grating; and
    a plurality of output waveguides connected to the second free space region.

6. A tunable integrated laser, comprising:
    a first frequency routing device in a semiconductive wafer having a first resolution;
    a second frequency routing device having a second resolution in series with the first frequency routing device;
    first and second spaced reflective surfaces formed in the wafer;
    a first plurality of waveguides connecting the first reflective surface to the first frequency routing device;
    a second plurality of waveguides connecting the second frequency routing device to the second reflective surface;
    a optical amplifier in series with each of the first and second pluralities of waveguides;
    a third plurality of waveguides connecting the first and second frequency routing devices in series;
    an optical amplifier in series with each of the third plurality of waveguides; and
    a means for providing bias current to selected ones of the optical amplifiers for tuning the laser to a predetermined output optical frequency.

* * * * *